United States Patent
Choi

(10) Patent No.: US 9,961,773 B2
(45) Date of Patent: May 1, 2018

(54) PRINTED CIRCUIT BOARD ASSEMBLY

(71) Applicant: Samsung Display Co., Ltd., Yongin-si, Gyeonggi-do (KR)

(72) Inventor: Dongwan Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 134 days.

(21) Appl. No.: 14/929,127

(22) Filed: Oct. 30, 2015

(65) Prior Publication Data

US 2016/0286649 A1 Sep. 29, 2016

(30) Foreign Application Priority Data

Mar. 23, 2015 (KR) ........................ 10-2015-0040184

(51) Int. Cl.
| | |
|---|---|
| *H05K 1/14* | (2006.01) |
| *H05K 1/02* | (2006.01) |
| *H05K 3/36* | (2006.01) |
| *H05K 3/32* | (2006.01) |

(52) U.S. Cl.
CPC .......... *H05K 1/147* (2013.01); *H05K 1/0259* (2013.01); *H05K 3/361* (2013.01); *H05K 3/323* (2013.01); *H05K 2201/09409* (2013.01); *H05K 2201/10128* (2013.01)

(58) Field of Classification Search
CPC ...... H05K 1/147; H05K 1/0259; H05K 3/361; H05K 3/323; H05K 2201/09409; H05K 2201/101218
USPC ........................................................ 361/749
See application file for complete search history.

(56) References Cited

U.S. PATENT DOCUMENTS

| | | | |
|---|---|---|---|
| 2007/0102830 A1* | 5/2007 | Muto ................... | H05K 1/0219 257/784 |
| 2009/0008131 A1* | 1/2009 | Shibata ................ | H05K 1/0219 174/254 |
| 2010/0285676 A1* | 11/2010 | Ikeuchi ................. | H01R 12/57 439/65 |
| 2014/0227830 A1 | 8/2014 | Yao et al. | |

FOREIGN PATENT DOCUMENTS

| | | |
|---|---|---|
| JP | 07-015106 A | 1/1995 |
| KR | 10-2007-0062107 A | 6/2007 |
| KR | 10-2012-0075114 A | 7/2012 |

* cited by examiner

*Primary Examiner* — Jenny L Wagner
*Assistant Examiner* — Michael P McFadden
(74) *Attorney, Agent, or Firm* — Lewis Roca Rothgerber Christie LLP

(57) ABSTRACT

A printed circuit board assembly includes: a first signal terminal row including a plurality of first signal terminals connected to a plurality of signal wirings of a flexible printed circuit board (FPCB), respectively; a first ground terminal row spaced from the first signal terminal row and including a plurality of first ground terminals connected to a plurality of ground wirings of the FPCB, respectively; a second signal terminal row including a plurality of second signal terminals connected to a plurality of signal wirings of a printed circuit board (PCB), respectively; and a second ground terminal row spaced from the second signal terminal row and including a plurality of second ground terminals connected to a plurality of ground wirings of the PCB, respectively. The first ground terminal row is closer to an end portion of the FPCB than the first signal terminal row.

17 Claims, 9 Drawing Sheets

PRINTED CIRCUIT BOARD ASSEMBLY

CROSS-REFERENCE TO RELATED APPLICATION

This application claims the priority to and all the benefits accruing under 35 U.S.C. § 119 of Korean Patent Application No. 10-2015-0040184, filed on Mar. 23, 2015, with the Korean Intellectual Property Office (KIPO), the disclosure of which is incorporated herein in its entirety by reference.

BACKGROUND

1. Field

One or more aspects of example embodiments of the present invention relate to an organic light emitting diode ("OLED") display device.

2. Description of the Related Art

Display devices, such as televisions (TVs) or monitors that output image information, include image display devices that display images, and circuit devices that output image signals for displaying the images. With the development of information technology in society, demands for display devices have been diversified, thus leading to an increased use of large size flat panel display ("FPD") devices, such as liquid crystal display ("LCD") devices and organic light emitting diode ("OLED") display devices. Such an FPD device includes a flat display panel including a plurality of pixels and a circuit unit that applies signals to the flat display panel.

The FPD device generally includes a first substrate on which signal wiring that transmits signals for displaying images, and switching elements for driving pixels, are formed, and also includes a second substrate bonded to the first substrate while being opposite thereto.

In general, the circuit unit includes a system that applies signals for displaying an image, and that supplies power, a control substrate having a controller and the like that converts the signals applied from the system into signals to be applied to the flat display panel, and a driver substrate that processes the signals converted by the control substrate to transmit the processed signals to the flat display panel.

Flexible printed circuit boards (FPCBs) are widely used to connect a plurality of signal wirings between the control substrate and the driver substrate. The signal wirings may be arranged in parallel, and may transmit image information. A plurality of signal wirings may be located on an FPCB to transmit signals for driving an OLED display device. In this case, a malfunction of, and damage to, an integrated circuit and an electronic component on a printed circuit board (PCB) may occur due to externally generated electrostatic discharge (ESD). As used herein, the term "ESD" refers to a phenomenon in which an electrically charged object contacts another object having a potential/voltage difference therebetween, to thereby momentarily cause a charge transfer. Leakage current, and the like, generated by ESD may result in a hard-error that causes a physical defect (e.g., damage to an element or a component) of an integrated circuit and an electronic component on a PCB, and/or a soft-error that causes a malfunction of a device.

An electronic device generally employs a scheme of shielding from an inflow of static electricity by inserting a wiring having a ground (GND) potential into an outer portion of a wiring of an FPCB, or between signal wirings of the FPCB. However, there is a limit in shielding from such an external inflow of static electricity through a bonding portion at which ground wirings are bonded to one another.

The above information disclosed in this Background section is only for enhancement of understanding of the background of the present invention, and therefore, it may contain information that does not form prior art.

SUMMARY

One or more aspects of embodiments of the present invention are directed to a printed circuit board assembly ("PBA") capable of preventing a malfunction of, and damage to, an integrated circuit and an electronic component on a printed circuit board ("PCB"), the malfunction and damage occurring due to electrostatic discharge ("ESD").

One or more aspects of example embodiments of the present invention are directed to a PBA in which the effect of electrostatic discharge ("ESD") is absent in a bonding portion between an electrode terminal of a printed circuit board ("PCB") and an electrode terminal of a flexible printed circuit board ("FPCB").

According to an exemplary embodiment of the present invention, a printed circuit board assembly includes: a flexible printed circuit board and a printed circuit board, each including a plurality of signal wirings and a plurality of ground wirings; a first signal terminal row including a plurality of first signal terminals, the plurality of first signal terminals being connected to the plurality of signal wirings of the flexible printed circuit board, respectively; a first ground terminal row spaced from the first signal terminal row of the flexible printed circuit board and including a plurality of first ground terminals, the plurality of first ground terminals being connected to the plurality of ground wirings of the flexible printed circuit board, respectively; a second signal terminal row including a plurality of second signal terminals, the plurality of second signal terminals being connected to the plurality of signal wirings of the printed circuit board, respectively; and a second ground terminal row spaced from the second signal terminal row of the printed circuit board and including a plurality of second ground terminals, the a plurality of second ground terminals being connected to the plurality of ground wirings of the printed circuit board, respectively, wherein the first ground terminal row is closer to an end portion of the flexible printed circuit board than the first signal terminal row.

The second signal terminal row may be closer to an end portion of the printed circuit board than the second ground terminal row.

At least one of the first ground terminals may have an area that is greater than an area of one of the first signal terminals.

The first signal terminal row may be parallel to the first ground terminal row.

At least one of the second ground terminals may have an area that is greater than an area of one of the second signal terminals.

The printed circuit board assembly may further include: a first anisotropic conductive film bonding the first signal terminals to the second signal terminals, respectively; and a second anisotropic conductive film bonding the first ground terminals to the second ground terminals, respectively, wherein the first anisotropic conductive film may have electric conductivity in a vertical direction greater than electric conductivity in a vertical direction of the second anisotropic conductive film.

The second anisotropic conductive film may have a distribution ratio of conductive particles that is greater than a distribution ratio of conductive particles of the first anisotropic conductive film.

According to another exemplary embodiment of the present invention, a printed circuit board assembly includes: a flexible printed circuit board and a printed circuit board, each including a plurality of signal wirings and a ground wiring; a first signal terminal row including a plurality of first signal terminals, the plurality of first signal terminals being connected to the plurality of signal wirings of the flexible printed circuit board, respectively; a first ground terminal spaced from the first signal terminal row and connected to the ground wiring of the flexible printed circuit board; a second signal terminal row including a plurality of second signal terminals, the plurality of second signal terminals being connected to the plurality of signal wirings of the printed circuit board, respectively; and a second ground terminal spaced from the second signal terminal row and connected to the ground wiring of the printed circuit board, wherein the first ground terminal has an area that is greater than an area of one of the first signal terminals.

The ground wiring may have a line width that is greater than a line width of one of the signal wirings.

The first ground terminal may include a terminal protrusion extending in a direction of the signal wirings, the terminal protrusion being spaced from a side of the first signal terminal row.

The terminal protrusion may extend from one or more ends of the first ground terminal.

The printed circuit board assembly may further include: a first anisotropic conductive film bonding the first signal terminals to the second signal terminals, respectively; and a second anisotropic conductive film bonding the first ground terminal to the second ground terminal, wherein the second anisotropic conductive film may have electric conductivity in a vertical direction that is greater than electric conductivity in a vertical direction of the first anisotropic conductive film.

The second anisotropic conductive film may have a distribution ratio of conductive particles that is greater than a distribution ratio of conductive particles of the first anisotropic conductive film.

The second anisotropic conductive film may include a conductive particle having a diameter that is greater than a diameter of a conductive particle of the first anisotropic conductive film.

According to another, exemplary embodiment of the present invention, a printed circuit board assembly includes: a flexible printed circuit board and a printed circuit board, each including a plurality of signal wirings and a ground wiring; a first signal terminal row including a plurality of first signal terminals, the plurality of first signal terminals being connected to the plurality of signal wirings of the flexible printed circuit board, respectively; a first ground terminal spaced from the first signal terminal row and connected to the ground wiring of the flexible printed circuit board; a second signal terminal row including a plurality of second signal terminals, the plurality of second signal terminals being connected to the plurality of signal wirings of the printed circuit board, respectively; and a second ground terminal spaced from the second signal terminal row and connected to the ground wiring of the printed circuit board, wherein the second ground terminal has an area that is greater than an area of one of the second signal terminals.

The ground wiring may have a line width that is greater than a line width of one of the signal wirings.

The second ground terminal may include a terminal protrusion extending in a direction of the signal wirings, the terminal protrusion being spaced from a side of the second signal terminal row.

The printed circuit board assembly may further include: a first anisotropic conductive film bonding the first signal terminals to the second signal terminals, respectively; and a second anisotropic conductive film bonding the first ground terminal to the second ground terminal, wherein the second anisotropic conductive film may have electric conductivity in a vertical direction that is greater than electric conductivity in a vertical direction of the first anisotropic conductive film.

The second anisotropic conductive film may have a distribution ratio of conductive particles that is greater than a distribution ratio of conductive particles of the first anisotropic conductive film.

The second anisotropic conductive film may include a conductive particle having a diameter that is greater than a diameter of a conductive particle of the first anisotropic conductive film.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of embodiments of the present invention will be more clearly understood from the following detailed description taken in conjunction with the accompanying drawings, in which.

DETAILED DESCRIPTION

Figure 1:
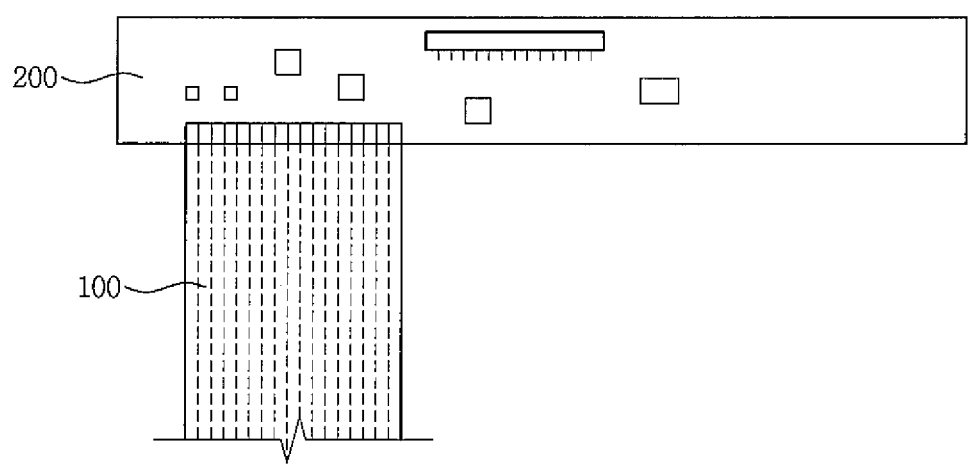
FIG. 1 is a plan view illustrating a printed circuit board assembly.

Hereinafter, example embodiments of the present invention will now be described in more detail with reference to the accompanying drawings.

However, the present invention may be embodied in various different forms, and should not be construed as being limited to the exemplary embodiments set forth herein. Rather, these exemplary embodiments are provided so that this disclosure will be thorough and complete, and will fully convey the spirit and scope of the present invention to those skilled in the art.

In the drawings, the relative sizes of elements, layers, and regions may be exaggerated for clarity. Spatially relative terms, such as "beneath," "below," "lower," "under," "above," "upper," and the like, may be used herein for ease of explanation to describe one element's or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that although the terms "first," "second," and the like may be used herein to describe various elements, components, areas, layers, and/or sections, these elements, components, areas, layers, and/or sections should not be limited by these terms. These terms are only used to distinguish one element, component, area, layer, or section from another element, component, area, layer, or section. Thus, a first element, component, area, layer, or section discussed below could be termed a second element, component, area, layer, or section without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only, and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements, and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When it is determined that a detailed description of some aspect may make the purpose of embodiments of the present invention unnecessarily ambiguous in the description of the present invention, such a detailed description may be omitted. In addition, the same components and corresponding components are given the same reference numeral throughout.

Unless otherwise defined, all terms (including technical and scientific terms) used herein have the same meaning as commonly understood by one of ordinary skill in the art(s) to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, exemplary embodiments with reference to a printed circuit board assembly will be more clearly understood from the following description taken in conjunction with the accompanying drawings.

Figure 2:
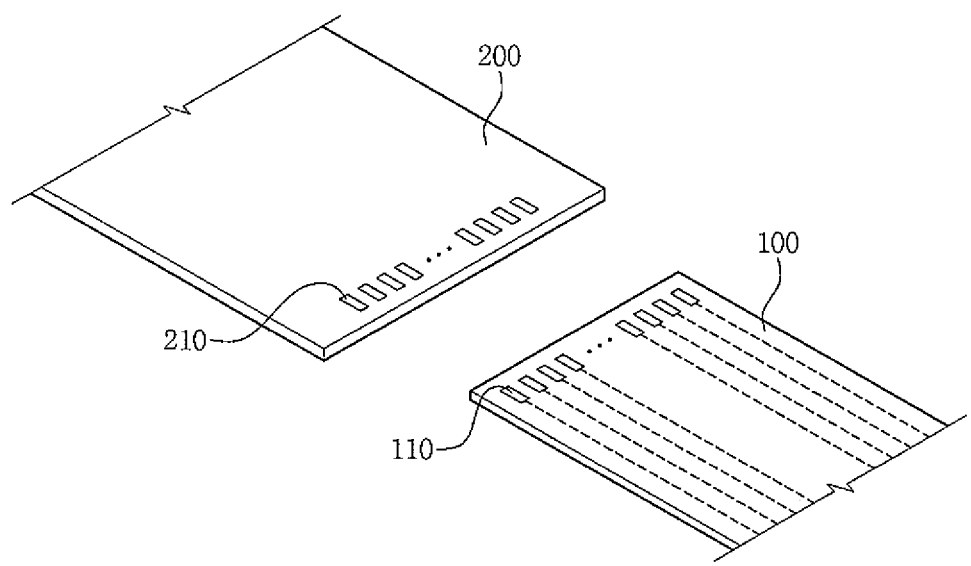
FIG. 2 is a perspective view illustrating a printed circuit board assembly.

FIGS. 1 and 2 are views illustrating a coupled structure of a flexible printed circuit board ("FPCB") 100 and a printed circuit board ("PCB") 200. An end portion of the FPCB 100 may be connected to the PCB 200, and another end portion of the FPCB 100 may be connected to (e.g., directly connected to) another FPCB, or to a terminal of a display device panel. The FPCB 100 may supply power to electronic elements mounted on the PCB 200, or may transmit electronic signals processed in an integrated circuit to another device.

The FPCB 100 may include a plurality of signal wirings and a plurality of ground wirings therein. The signal wirings and the ground wirings of the FPCB 100 may be exposed so that they may be connected to an external circuit by a same terminal unit 110. The terminal unit 110 of the FPCB 100 and a terminal unit 210 of the PCB 200 may be electrically connected to each other through, for example, an anisotropic conductive film ("ACF"). The terminal unit 110 of the FPCB 100 and the terminal unit 210 of the PCB 200 may be connected to each other in, for example, one-to-one correspondence. The terminal units 110 and 210 may be formed in the same row to have the same terminal form without distinction between a terminal connected to a signal wiring and a terminal connected to a ground wiring.

Since electrostatic discharge ("ESD") is affected by noise due to externally accumulated static electricity, a PCB and an FPCB employ a scheme of reducing noise occurring due to ESD in which a plurality of ground wirings are located, or in which a ground area is designed, to occupy a relatively large space therein. However, in a case in which ESD is applied to a terminal unit through which the PCB and the FPCB are connected, noise may be directly generated, thus resulting in malfunction of an electronic device through a circuit wiring.

Figure 3:
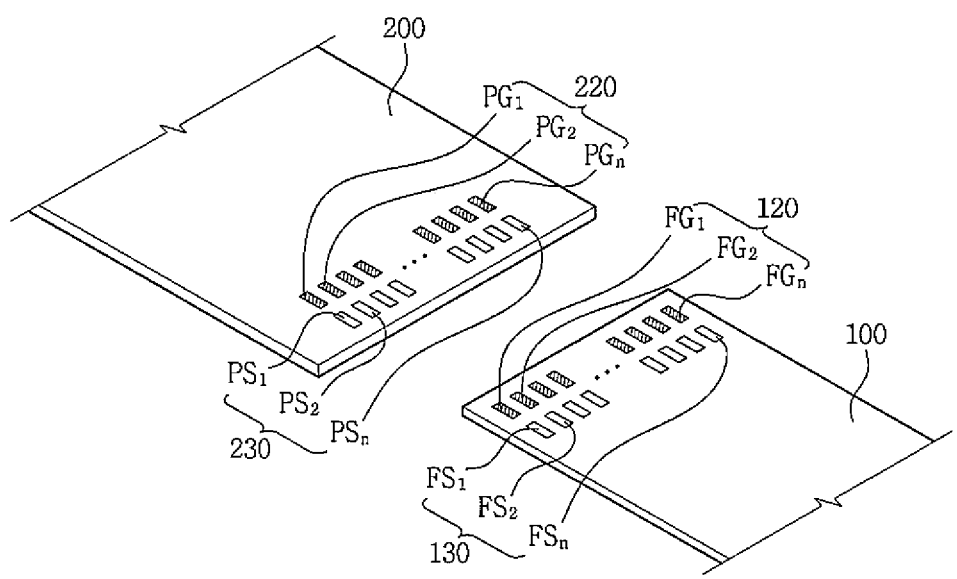
FIG. 3 is a perspective view illustrating a printed circuit board assembly according to an exemplary embodiment.

FIG. 3 is a perspective view illustrating a printed circuit board assembly according to an exemplary embodiment.

A signal wiring and a ground wiring of an FPCB 100 may extend in parallel to, and insulated from, one another by a film. The FPCB 100 may have a stacked structure in which a copper layer is stacked on a base layer formed of an insulating film to form a wiring unit (e.g., wiring portion), and a protective film is formed on the copper layer. The FPCB 100 according to an exemplary embodiment may include a conductive signal wiring and a conductive ground wiring. The signal wiring and the ground wiring may be formed of the same copper layer or may be formed of different layers. Since the wiring unit of the FPCB 100 is not exposed externally due to the protective film, an exposed terminal unit (e.g., a terminal area) may be utilized to output a signal externally. The terminal unit may undergo a surface treatment such as plating to prevent or substantially prevent the exposure of the copper layer caused by the removal of the protective film, discoloration, and/or surface oxidation.

A first ground terminal row 120 shown in FIG. 3 may include ground terminals FG1, FG2, . . . FGn, and a first signal terminal row 130 may include signal terminals FS1, FS2, . . . FSn. The ground terminals FG1, FG2, . . . FGn of the first ground terminal row 120 may be connected to ground terminals PG1, PG2, . . . PGn of a second ground terminal row 220, respectively. The signal terminals FS1, FS2, . . . FSn of the first signal terminal row 130 may be connected to signal terminals PS1, PS2 . . . PSn of a second signal terminal row 230, respectively. The first ground terminal row 120 of the FPCB 100 may be spaced from the first signal terminal row 130, while being parallel to one another, and the first ground terminal row 120 may be located adjacent an outer end portion of the FPCB 100 based on the direction in which the signal wiring extends. In other words, the first ground terminal row 120 may be located closer to the outer end portion of the FPCB 100 than the first signal terminal row 130 is to the outer end portion of the FPCB 100 (e.g., the first ground terminal row 120 may be between the outer end portion of the FPCB 100 and the first signal terminal row 120). By arranging the ground terminals in a path through which ESD may be typically applied, the first ground terminal row 120 may shield from an external inflow of ESD to the signal wiring.

In addition, the first and second ground terminal rows 120 and 220 may be located closer to the outer end portion of the FPCB 100 than the first and second signal terminal rows 130 and 230, such that an effect of preventing or reducing the infiltration of external moisture into the signal wiring may be achieved. The first and second ground terminal rows 120 and 220, which are more subject to exposure to external environment than the first and second signal terminal rows 130 and 230, may serve to reduce the short-circuit, discoloration, migration, and the like, of the signal wiring due to the infiltration of moisture, salinity, or gas that may occur while an electronic device is in use. The ground terminal row may enable an overall electronic device system to stably operate, even in a case of a short-circuit occurring in at least one of the wirings due to moisture.

Figure 4:
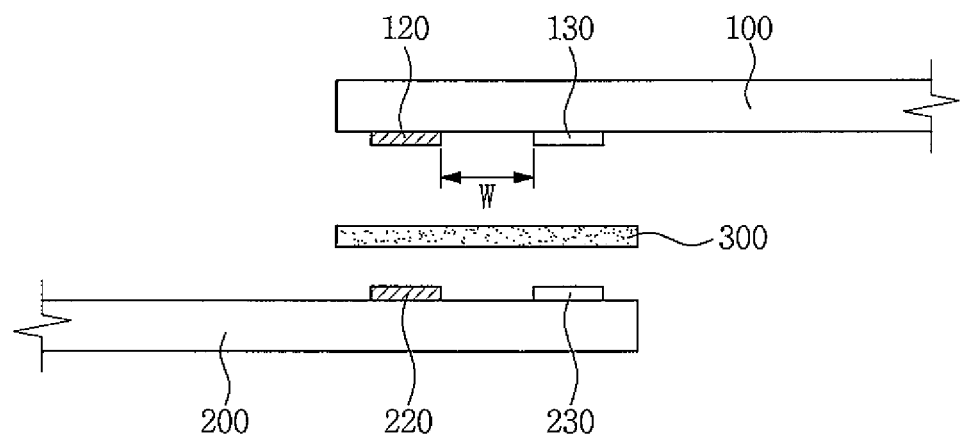
FIG. 4 is a side cross-sectional view illustrating a printed circuit board assembly according to an exemplary embodiment.

FIG. 4 is a side cross-sectional view of a printed circuit board assembly according to an exemplary embodiment.

The first ground terminal row 120 and the first signal terminal row 130 of the FPCB 100 may be electrically coupled to the second ground terminal row 220 and the second signal terminal row 230 of the PCB 200, respectively, using an anisotropic conductive film ("ACE") 300 therebetween. The ACF 300 may be an adhesive member having a film shape in which conductive particles are dispersed in a resin, such as an epoxy. The ACF 300 generally refers to a polymer layer having electric anisotropy in which conductivity is exhibited in a direction of a thickness of a film (e.g., in a vertical direction), and an insulating property that is exhibited in a direction of a surface of the film having adhesiveness. The polymer layer may be obtained through a thermo-compression process. When the ACF 300 is located between terminals, which are to be coupled to each other, and undergoes heating and compression processes, an electric connection may be formed between vertically adjacent terminals by a conductive particle, and insulation may be maintained between horizontally adjacent terminals due to an insulating adhesive resin being filled therebetween, and thus, the conductive particle not being connected thereto. To enhance the adhesive reliability of the terminal unit, a distance W between the first signal terminal row 130 and the first ground terminal row 120 may be formed to be greater than or equal to an interval between signal terminals.

Figure 5:
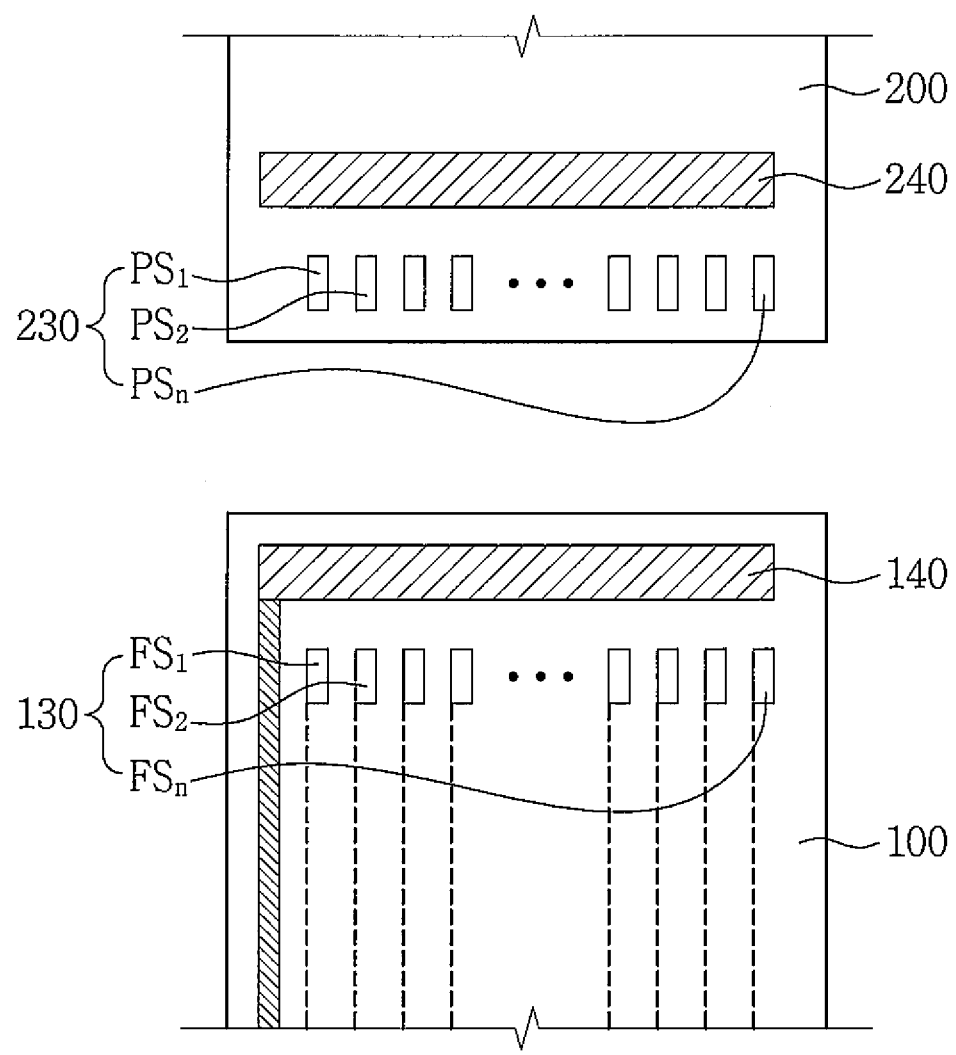
FIG. 5 is a plan view illustrating a printed circuit board assembly according to another exemplary embodiment.

FIG. 5 is a plan view illustrating a printed circuit board assembly according to another exemplary embodiment.

A second signal terminal row 230 of a PCB 200 corresponding to a first signal terminal row 130 of an FPCB 100 may be electrically connected to each other through respective individual terminals. A first ground terminal 140 of the FPCB 100 may have a larger pad area than that of a signal terminal from among the first signal terminal row 130. A second ground terminal 240 of the PCB 200, which corresponds to the first ground terminal 140, may be a terminal having a larger exposed area than that of a signal terminal from among the second signal terminal row 230, in a manner similar to that of the first ground terminal 140. A signal wiring may be a wiring that transmits different signals for operation of a display device, while a ground wiring may not necessarily be separated from another ground wiring, since the ground wirings have a common ground potential therebetween. When the ground terminal secures a large connection area, connection resistance in a terminal connection portion may decrease, and thus, an effect of externally applied ESD may be effectively suppressed.

Referring to FIG. 5, the ground wiring may be parallel to the signal wiring, and may extend along a side surface of the FPCB 100 (e.g., a left side of the FPCB 100 in FIG. 5) to be connected to the first ground terminal 140. The first ground terminal 140 of the FPCB 100 may be electrically connected to the second ground terminal 240 of the PCB 200. The first ground terminal 140 may be connected to a ground wiring of the FPCB 100, and the ground wiring may have a greater line width than that of the signal wiring. Although FIG. 5 illustrates a single ground wiring being connected to the first ground terminal 140, a plurality of ground wirings formed on more than one surface of the FPCB 100 may be connected to the first ground terminal 140, and a ground wiring located between the signal wirings may be connected to the first ground terminal 140. Through the first and second ground terminals 140 and 240 located at one side of the first and second signal terminal rows 130 and 230, respectively, a malfunction in an electronic device caused by an external inflow of ESD through the signal wiring may be effectively prevented.

Further, through the first and second ground terminals 140 and 240, the signal wiring may be protected from the short-circuit, discoloration, migration, and the like, of the signal wiring due to the infiltration of moisture, salinity, or gas that may occur while a display device is in use. Although not illustrated, a ground wiring may further be formed in an area between signal wirings, in addition to an outer side portion of the FPCB 100, and thereby, ground wiring resistance within the FPCB 100 may decrease.

Figure 6:
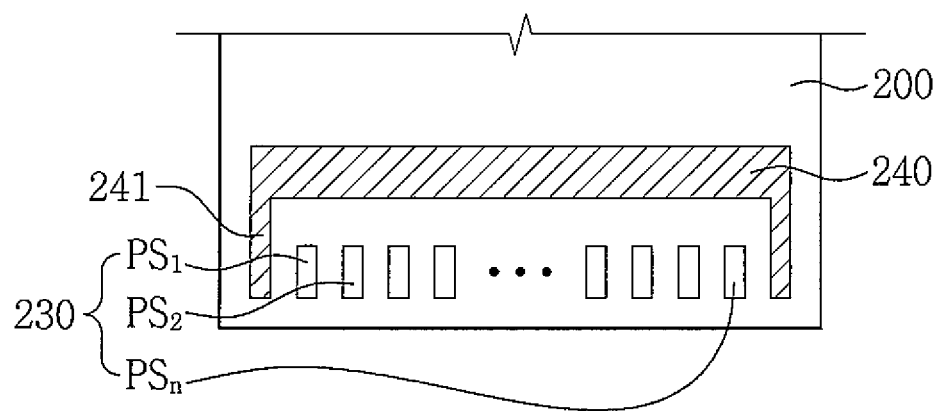
FIG. 6 is a plan view illustrating a printed circuit board assembly according to still another exemplary embodiment.
Figure 6:
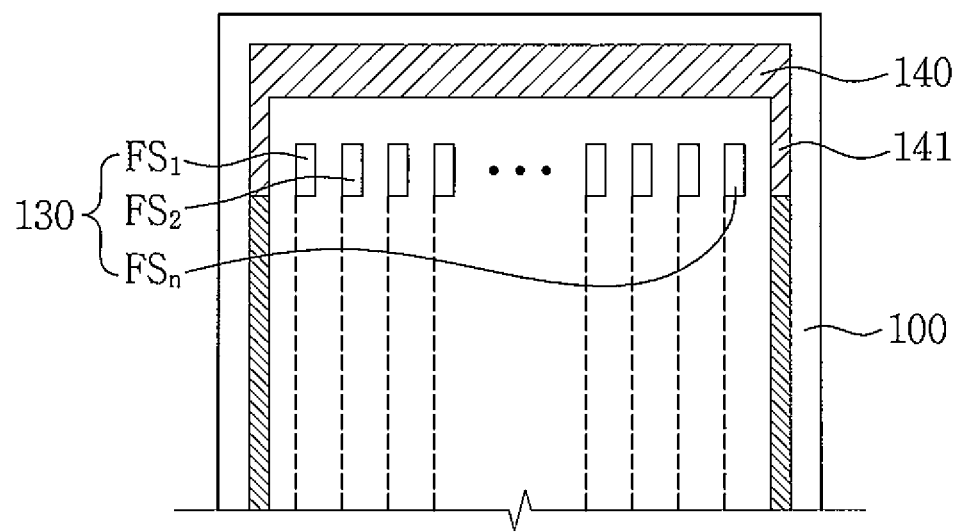

FIG. 6 is a plan view illustrating a printed circuit board assembly according to still another exemplary embodiment.

As illustrated in FIG. 6, a first ground terminal 140 of an FPCB 100, and a second ground terminal 240 of a PCB 200, may include terminal protrusions 141 and 241 that protrude in a direction toward a signal terminal row, and that are located at ends (e.g., sides) of the FPCB 100 and the PCB 200, respectively. The terminal protrusions 141 and 241 may be respectively electrically connected to a corresponding ground terminal, and the ground terminal including the terminal protrusions 141 and 241 shown in FIG. 6 may be located at three surfaces/sides of a first signal terminal row 130 or a second signal terminal row 230 (e.g., in a shape).

The ground terminal including the terminal protrusions 141 and 241 according to the present exemplary embodiment illustrated in FIG. 6 may have an excellent shielding function against ESD applied laterally from the terminal unit of the FPCB 100, in addition to ESD applied from the PCB 200. Further, even in a case of the external infiltration of moisture, salinity, gas, and the like, the ground terminal including the terminal protrusion according to an exemplary embodiment may exhibit an excellent shielding function by surrounding the three surfaces of the first or second signal terminal row 130 or 230.

The ground wiring of the FPCB 100 may be formed, for example, adjacent an outer portion of a side of the FPCB 200. In addition, a width of the ground wiring may be formed to be greater than a width of a signal wiring, such that ground wiring resistance may decrease. When resistance of the ground wiring is relatively high, an undesired noise voltage may be excited due to an ESD current flowing through the ground wiring and due to ground wiring resistance, and the generated voltage may affect the signal wiring, thus resulting in a malfunction of a circuit device.

Figure 7:
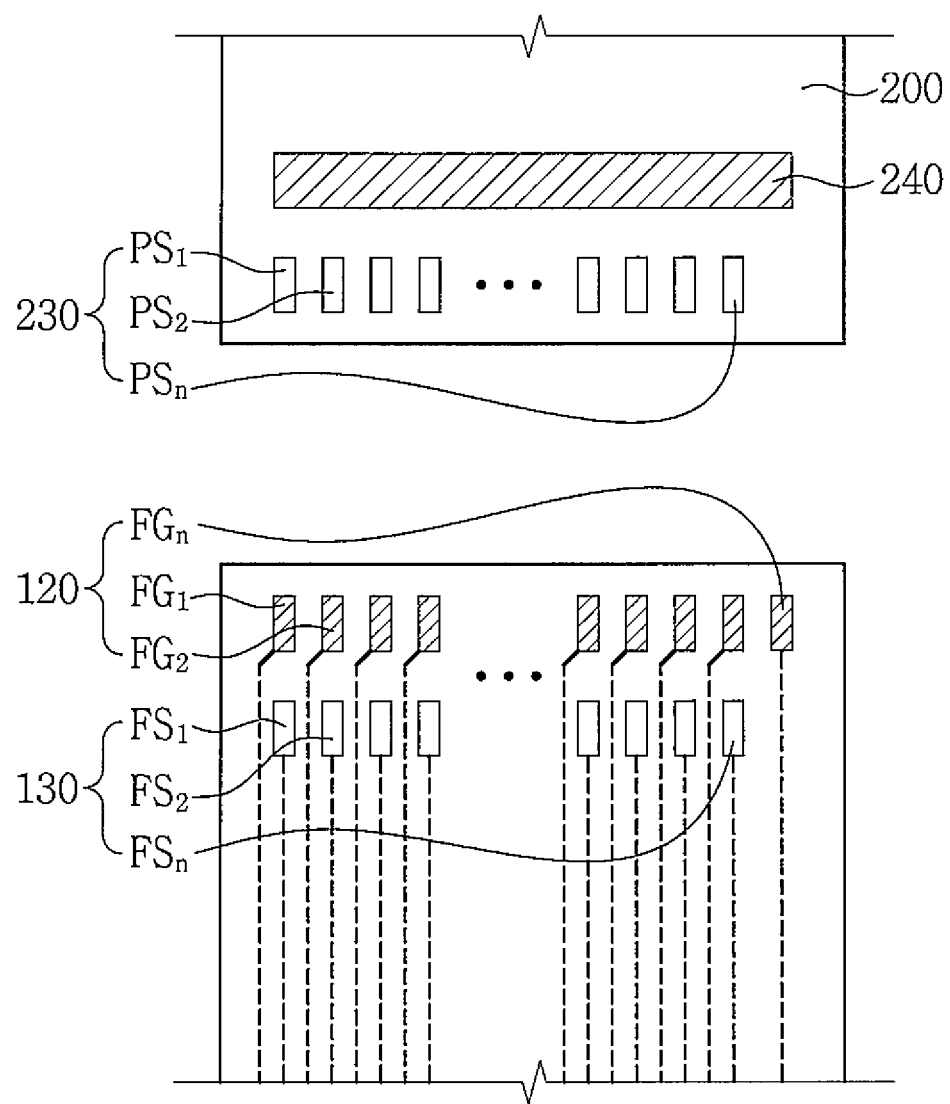
FIG. 7 is a plan view illustrating a printed circuit board assembly according to yet another exemplary embodiment.

FIG. 7 is a plan view illustrating a printed circuit board assembly according to yet another exemplary embodiment.

Ground wirings connected to a first ground terminal row 120 including ground terminals FG1, FG2, . . . FGn of an FPCB 100, according to the present exemplary embodiment, may be located between signal wirings connected to signal terminals FS1, FS2, . . . FSn, with the signal wirings being adjacent the ground wirings. The first ground terminal row 120 including the plurality of ground terminals FG1, FG2, . . . FGn may be arranged along an end portion of the FPCB 100, and may be connected to a second ground terminal 240 of a PCB 200. In a structure according to the present exemplary embodiment illustrated in FIG. 7, a plurality of ground wirings may be used to reduce ground wiring resistance within the FPCB 100. In addition, the ground wiring may be located between the signal wirings, and thereby, a malfunction caused by ESD may be prevented or substantially prevented, and the effect of noise transmitted through the signal wiring may be reduced. The second ground terminal 240 of the PCB 200 may be elongatedly formed in parallel (e.g., in a horizontal direction) with the second signal terminal row 230 so as to be connected to the first ground terminal row 120. Although FIG. 7 illustrates a configuration in which a single second ground terminal 240 corresponds to the entirety of the second signal terminal row 230, the present invention is not limited thereto, and the second ground terminal 240 may include a plurality of second ground terminals according to some exemplary embodiments.

Figure 8:
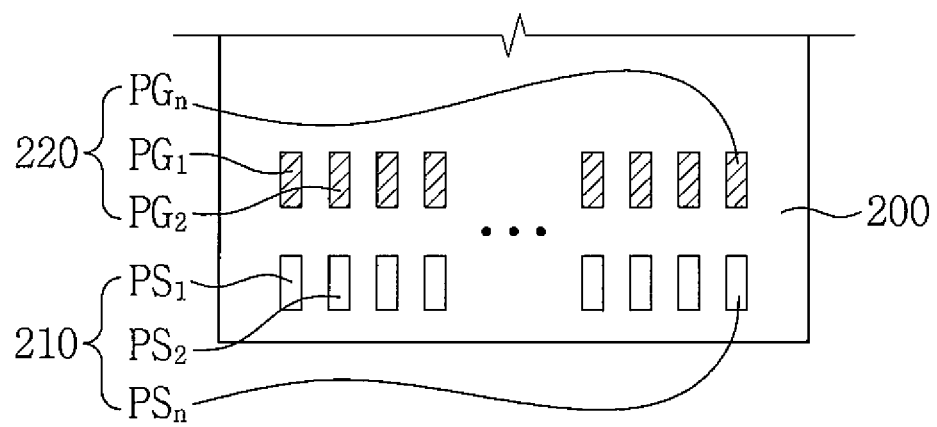
FIG. 8 is a plan view illustrating a printed circuit board assembly according to further another exemplary embodiment.
Figure 8:
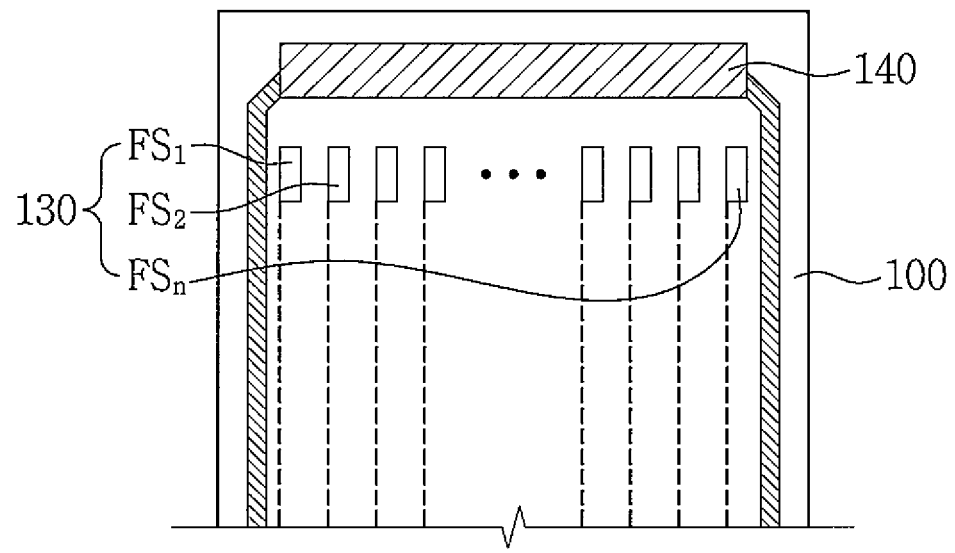

FIG. 8 is a plan view illustrating a printed circuit board assembly according to further another exemplary embodiment.

FIG. 8 illustrates a printed circuit board assembly having a structure in which a single first ground terminal 140 of an FPCB 100 is connected to a plurality of second ground terminals PG1, PG2, . . . PGn included in a second ground terminal row 220, in a manner dissimilar to that of FIG. 7. A ground wiring of the FPCB 100 may be located outwardly of a signal wiring so as to be connected to the first ground terminal 140. The second ground terminals PG1, PG2, . . . PGn of the PCB 200 may each be formed as an individual terminal unit in a manner similar to that of a signal terminal, and may constitute the second ground terminal row 220 in which adjacent ground terminals are arranged in a single row.

Although FIG. 8 illustrates a configuration in which the single first ground terminal 140 corresponds to the entirety of a first signal terminal row 130, the present invention is not limited thereto, and the first ground terminal 140 may include a plurality of first ground terminals according to some exemplary embodiments.

The structures of the ground terminals of FIGS. 7 and 8 may reduce (e.g., significantly reduce) connection resistance triggered by a connection between the terminals, thus effectively preventing or reducing externally applied ESD by using a ground potential.

With the miniaturization of electronic devices and the degree of integration thereof increasing, the number of signal wirings may increase, and a width of a signal terminal and an interval between terminals may decrease. Because a conductive particle of an ACF may have a smaller diameter than that of an existing conductive particle, and because the conductive particles may be uniformly arranged to connect a terminal of a high-definition FPCB to a terminal of a PCB, a manufacturing process thereof may be complicated. Through the use of the ground terminal structure according to some exemplary embodiments, a connection area between the ground terminals may be sufficiently secured. In addition, errors caused in association with a terminal connection issue may be reduced, such that a conductive particle of an ACF having a relatively great diameter may be made available for use. As the diameter of the conductive particle increases, electric conductivity of the ACF in a vertical direction may be enhanced to thereby reduce connection resistance in the connection area, and a malfunction occurring due to ESD may be reduced.

Figure 9:
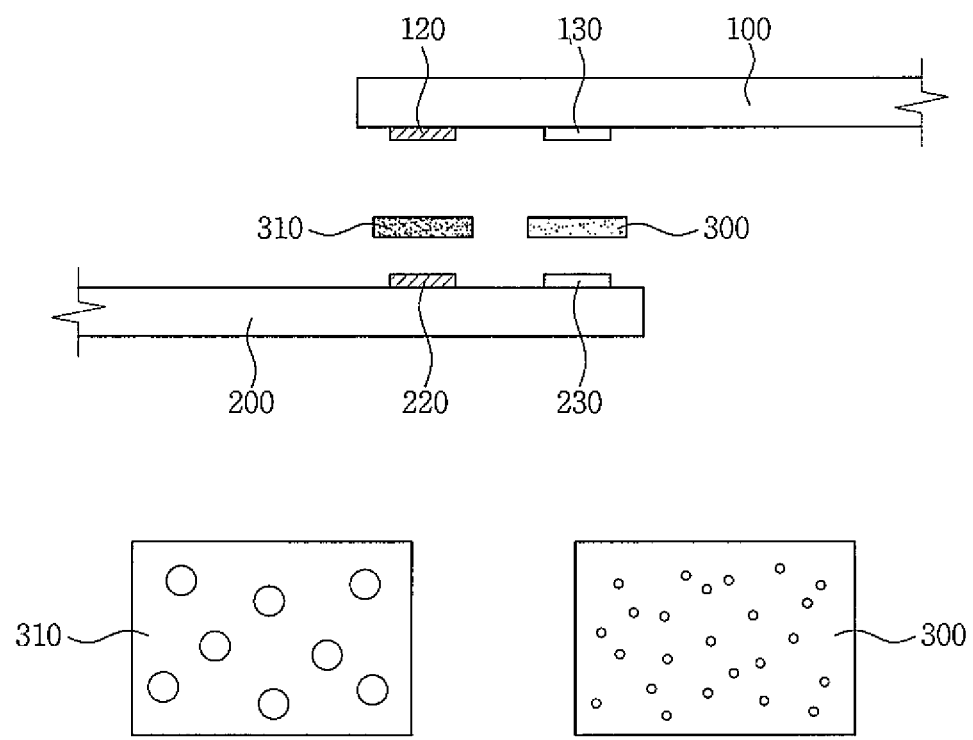
FIG. 9 includes a cross-sectional view illustrating a printed circuit board assembly according to still another exemplary embodiment.

FIG. 9 includes a cross-sectional view illustrating a printed circuit board assembly according to still another exemplary embodiment.

As illustrated in FIG. 9, different ACFs 300 and 310 may be used for bonding between a ground terminal and a signal terminal. A first ACF 300 may electrically connect a terminal of a first signal terminal row 130 to a terminal of a second signal terminal row 230, and a second ACF 310 may electrically connect a terminal of a first ground terminal row 120 to a terminal of a second ground terminal row 220.

A diameter of a conductive particle distributed in the second ACF 310 may be greater than a diameter of a conductive particle distributed in the first ACF 300. As the ACF is thermo-compressed, the conductive particle in the ACF may be compressed by electrode terminals thereabove and therebelow, thus having electric conductivity in a vertical direction. The conductive particle may have a sufficiently small size that does not allow conduction between horizontally adjacent terminals in a compressed state of the conductive particle. However, in a case of reducing the diameter of the conductive particle, overall electric conductivity may decrease, and in a case of increasing the diameter of the conductive particle, a short-circuit may occur between adjacent electrodes. In the present exemplary embodiment, the conductive particle of the first ACF 300 used to connect a signal electrode may use a conductive particle having a relatively small diameter, such that a short-circuit may not occur between adjacent electrodes, and the conductive particle of the second ACF 310 used to connect a ground electrode may use a conductive particle having a relatively large diameter so as to increase electric conductivity. The first ACF 300 and the second ACF 310 may be separately manufactured according to one embodiment, but may be integrally manufactured according to another embodiment.

In addition, electric conductivity may differ based on a distribution ratio of the conductive particles within the ACF. In a case of using conductive particles having the same size, the number of conductive particles to be distributed per unit volume may be set differently to change the number of conductive particles to be compressed in a unit area of a connection terminal. By setting a distribution ratio of the conductive particles of the second ACF 310 per unit volume (i.e., a number of conductive particles per unit volume, or a number of conductive particles per unit area) to be higher than a distribution ratio of the conductive particles of the first ACF 300 per unit volume, electric conductivity of the second ACF 310 may further be increased. The first ACF 300 and the second ACF 310, which have different distribution ratios, may be separately manufactured according to one embodiment, but may be integrally manufactured according to another embodiment.

As set forth above, according to one or more exemplary embodiments, ESD applied to the terminal unit of the FPCB and the PCB may be effectively shielded, thus preventing or substantially preventing a malfunction of an electronic device occurring due to the ESD.

From the foregoing, it will be appreciated that various embodiments in accordance with the present invention have been described herein for purposes of illustration, and that various modifications may be made without departing from the scope and spirit of the invention. Accordingly, the various exemplary embodiments disclosed herein are not intended to be limiting of the scope and spirit of the invention. Various features of the above described and other exemplary embodiments can be mixed and matched in any manner, to produce further exemplary embodiments consistent with the spirit and scope of the present invention, as defined by the following claims, and their equivalents.

What is claimed is:

1. A printed circuit board assembly comprising:
    a flexible printed circuit board and a printed circuit board, each comprising a plurality of signal wirings and a plurality of ground wirings;
    a first signal terminal row comprising a plurality of first signal terminals adjacently arranged with each other along a first direction, the plurality of first signal terminals being adjacently arranged on one surface of the flexible printed circuit board and connected to the plurality of signal wirings of the flexible printed circuit board, respectively;
    a first ground terminal row spaced from the first signal terminal row of the flexible printed circuit board in a second direction crossing the first direction and comprising a plurality of first ground terminals adjacently arranged with each other along the first direction, the plurality of first ground terminals being adjacently arranged on the one surface of the flexible printed circuit board and connected to the plurality of ground wirings of the flexible printed circuit board, respectively;
    a second signal terminal row comprising a plurality of second signal terminals, the plurality of second signal terminals being connected to the plurality of signal wirings of the printed circuit board, respectively; and
    a second ground terminal row spaced from the second signal terminal row of the printed circuit board and comprising a plurality of second ground terminals, the plurality of second ground terminals being connected to the plurality of ground wirings of the printed circuit board, respectively;
    a first anisotropic conductive film bonding the first signal terminals to the second signal terminals, respectively; and
    a second anisotropic conductive film bonding the first ground terminals to the second ground terminals, respectively,
    wherein the first anisotropic conductive film has electric conductivity in a vertical direction greater than electric conductivity in a vertical direction of the second anisotropic conductive film,
    wherein the first signal terminal row and the first ground terminal row are configured to face the second signal terminal row and the second ground terminal row, respectively, when the first signal terminal row is connected to the second signal terminal row and the first ground terminal row is connected to the second ground terminal row, and
    wherein the first ground terminal row is closer to an end portion of the flexible printed circuit board than the first signal terminal row.

2. The printed circuit board assembly of claim 1, wherein the second signal terminal row is closer to an end portion of the printed circuit board than the second ground terminal row.

3. The printed circuit board assembly of claim 1, wherein at least one of the first ground terminals has an area that is greater than an area of one of the first signal terminals.

4. The printed circuit board assembly of claim 1, wherein the first signal terminal row is parallel to the first ground terminal row.

5. The printed circuit board assembly of claim 1, wherein at least one of the second ground terminals has an area that is greater than an area of one of the second signal terminals.

6. The printed circuit board assembly of claim 1, wherein the second anisotropic conductive film has a distribution ratio of conductive particles that is greater than a distribution ratio of conductive particles of the first anisotropic conductive film.

7. A printed circuit board assembly comprising:
    a flexible printed circuit board and a printed circuit board, each comprising a plurality of signal wirings and a ground wiring;
    a first signal terminal row comprising a plurality of first signal terminals adjacently arranged with each other along a first direction on a surface of the flexible printed circuit board, the plurality of first signal terminals being connected to the plurality of signal wirings of the flexible printed circuit board, respectively;
    a first ground terminal extending in the first direction and spaced from the first signal terminal row in a second direction on the surface of the flexible printed circuit board crossing the first direction and connected to the ground wiring of the flexible printed circuit board;
    a second signal terminal row comprising a plurality of second signal terminals, the plurality of second signal terminals being connected to the plurality of signal wirings of the printed circuit board, respectively;
    a second ground terminal spaced from the second signal terminal row and connected to the ground wiring of the printed circuit board;
    a first anisotropic conductive film bonding the first signal terminals and the second signal terminals; respectively; and a second anisotropic conductive film bonding the first ground terminal and the second ground terminal, wherein the second anisotropic conductive film has greater electric conductivity in a vertical direction than electric conductivity in a vertical direction of the first anisotropic conductive film, wherein the first ground terminal has an area that is greater than a total area of the first signal terminal row, and wherein the first ground terminal is closer to an end portion of the flexible printed circuit board than the first signal terminal row.

8. The printed circuit board assembly of claim 7, wherein the ground wiring has a line width that is greater than a line width of one of the signal wirings.

9. The printed circuit board assembly of claim 7, wherein the first ground terminal comprises a terminal protrusion extending in a direction of the signal wirings, the terminal protrusion being spaced from a side of the first signal terminal row.

10. The printed circuit board assembly of claim 9, wherein the terminal protrusion extends from one or more ends of the first ground terminal.

11. The printed circuit board assembly of claim 10, wherein the second anisotropic conductive film has a distribution ratio of conductive particles that is greater than a distribution ratio of conductive particles of the first anisotropic conductive film.

12. The printed circuit board assembly of claim 10, wherein the second anisotropic conductive film comprises a conductive particle having a diameter that is greater than a diameter of a conductive particle of the first anisotropic conductive film.

13. A printed circuit board assembly comprising:
a flexible printed circuit board and a printed circuit board, each comprising a plurality of signal wirings and a ground wiring;
a first signal terminal row comprising a plurality of first signal terminals, the plurality of first signal terminals being connected to the plurality of signal wirings of the flexible printed circuit board, respectively;
a first ground terminal spaced from the first signal terminal row and connected to the ground wiring of the flexible printed circuit board;
a second signal terminal row comprising a plurality of second signal terminals adjacently arranged with each other along a first direction on a surface of the printed circuit board, the plurality of second signal terminals being connected to the plurality of signal wirings of the printed circuit board, respectively;
a second ground terminal extending in the first direction and spaced from the second signal terminal row in a second direction on the surface of the printed circuit board crossing the first direction and connected to the ground wiring of the printed circuit board;
a first anisotropic conductive film bonding the first signal terminals and the second signal terminals, respectively; and
a second anisotropic conductive film bonding the first ground terminal and the second ground terminal,
wherein the second anisotropic conductive film has greater electric conductivity in a vertical direction than electric conductivity in a vertical direction of the first anisotropic conductive film,
wherein the second ground terminal has an area that is greater than a total area of the second signal terminal row, and
wherein the first ground terminal is closer to an end portion of the flexible printed circuit board than the first signal terminal row.

14. The printed circuit board assembly of claim 13, wherein the ground wiring has a line width that is greater than a line width of one of the signal wirings.

15. The printed circuit board assembly of claim 13, wherein the second ground terminal comprises a terminal protrusion extending in a direction of the signal wirings, the terminal protrusion being spaced from a side of the second signal terminal row.

16. The printed circuit board assembly of claim 13, wherein the second anisotropic conductive film has a distribution ratio of conductive particles that is greater than a distribution ratio of conductive particles of the first anisotropic conductive film.

17. The printed circuit board assembly of claim 13, wherein the second anisotropic conductive film includes a conductive particle having a diameter that is greater than a diameter of a conductive particle of the first anisotropic conductive film.

* * * * *